US008046726B2

(12) United States Patent
Lakshmanan et al.

(10) Patent No.: US 8,046,726 B2
(45) Date of Patent: Oct. 25, 2011

(54) WAIVER MECHANISM FOR PHYSICAL VERIFICATION OF SYSTEM DESIGNS

(75) Inventors: Viswanathan Lakshmanan, Thornton, CO (US); Michael Josephides, Broomfield, CO (US); Lisa M. Miller, Windsor, CO (US)

(73) Assignee: LSI Corporation, Milpitas, CA (US)

( * ) Notice: Subject to any disclaimer, the term of this patent is extended or adjusted under 35 U.S.C. 154(b) by 529 days.

(21) Appl. No.: 12/211,238

(22) Filed: Sep. 16, 2008

(65) Prior Publication Data
US 2010/0070936 A1 Mar. 18, 2010

(51) Int. Cl.
G06F 17/50 (2006.01)
G06F 9/455 (2006.01)
(52) U.S. Cl. ...................................... 716/111
(58) Field of Classification Search ........... 716/50–55, 716/110–112
See application file for complete search history.

(56) References Cited

U.S. PATENT DOCUMENTS

| | | | |
|---|---|---|---|
| 5,694,481 A | 12/1997 | Lam et al. | 382/145 |
| 6,425,117 B1 | 7/2002 | Pasch et al. | 716/21 |
| 6,678,645 B1 | 1/2004 | Rajsuman et al. | 703/20 |
| 6,701,504 B2 | 3/2004 | Chang et al. | 716/10 |
| 6,904,397 B1 | 6/2005 | Fields et al. | 703/14 |
| 6,922,823 B2 | 7/2005 | Tester | 716/10 |
| 7,221,788 B2 | 5/2007 | Schulze et al. | 382/144 |
| 7,240,305 B2 | 7/2007 | Lippincott | 716/4 |
| 7,284,214 B2 | 10/2007 | LeBritton et al. | 716/5 |
| 7,415,695 B2 * | 8/2008 | Bergman et al. | 716/52 |
| 2007/0192754 A1 * | 8/2007 | Hofsaess | 716/5 |
| 2007/0234264 A1 * | 10/2007 | Ono | 716/11 |
| 2007/0283307 A1 * | 12/2007 | Arizono | 716/10 |
| 2008/0066042 A1 * | 3/2008 | Archambeault et al. | 716/11 |
| 2008/0077891 A1 * | 3/2008 | Dooling et al. | 716/4 |
| 2008/0141195 A1 * | 6/2008 | Torres Robles et al. | 716/5 |
| 2008/0172640 A1 * | 7/2008 | Fenkes et al. | 716/5 |
| 2008/0184183 A1 * | 7/2008 | Kobayashi | 716/9 |
| 2010/0257496 A1 * | 10/2010 | Ferguson et al. | 716/5 |

* cited by examiner

Primary Examiner — Stacy Whitmore
(74) Attorney, Agent, or Firm — Christoper P. Maiorana, PC

(57) ABSTRACT

A method of waiving verification failures is disclosed. The method generally includes the steps of (A) generating a plurality of circuit error files by performing a plurality of physical verifications on a plurality of circuit designs, the circuit error files containing a plurality of circuit errors of the circuit designs, (B) generating a system error file by performing an additional physical verification on a system design, the system error file containing a plurality of system errors of the system design, the system design incorporating the circuit designs and (C) generating a valid error file by removing the circuit errors from the system error file, the valid error file containing a plurality of valid errors comprising a subset of the system errors.

20 Claims, 3 Drawing Sheets

WAIVER MECHANISM FOR PHYSICAL VERIFICATION OF SYSTEM DESIGNS

FIELD OF THE INVENTION

The present invention relates to circuit design checking generally and, more particularly, to a method and/or apparatus for implementing a waiver mechanism for physical verification of system designs.

BACKGROUND OF THE INVENTION

Circuit designs are getting larger and more complex at the 90 nanometer and smaller technology nodes. Because the time to market is shrinking with advancements in technology and product innovation, design teams struggle with meeting tight schedules and remaining under budget. Factoring in Intellectual Property (IP) co-development, a verification methodology that is able to service the criteria of a customer for both quality of results and turnaround time is desired. With IP co-development, not all building blocks for a System-On-a-Chip (SoC) design are available off-the-shelf during an SoC build and integration. As a result, an intelligent "waiver" mechanism for Design Rule Checks (DRCs) pertaining to the IP is often sought. The SoC designers have to integrate IP that is not DRC clean owing to various reasons. For example, the IP received by the SoC designers may lack layer-identifications and/or incomplete verification of the IP at the Graphic Data System II (GDSII) format level. As the IP is being co-developed, some aspects of the IP have not been fully developed and/or validated. Scheduling on the SoC design to make progress at the top (design) level remains a reality even though the IP building blocks are not fully in place. Furthermore, a dynamic nature of process rule specifications create problems, whereby the place and route (i.e., design implementation) systems cannot keep pace and verification does not happen until the very end of the development cycle.

SUMMARY OF THE INVENTION

The present invention concerns a method of waiving verification failures. The method generally includes the steps of (A) generating a plurality of circuit error files by performing a plurality of physical verifications on a plurality of circuit designs, the circuit error files containing a plurality of circuit errors of the circuit designs, (B) generating a system error file by performing an additional physical verification on a system design, the system error file containing a plurality of system errors of the system design, the system design incorporating the circuit designs and (C) generating a valid error file by removing the circuit errors from the system error file, the valid error file containing a plurality of valid errors comprising a subset of the system errors.

The objects, features and advantages of the present invention include providing a method and/or apparatus for implementing a waiver mechanism for physical verification of system designs that may (i) provide a waiver mechanism schema to reduce a number of system level verification failures, (ii) remove acceptable verification errors from consideration during development, (iii) optimize a design workflow, (iv) optimize a verification workflow, (v) identify and distinguish errors that are IP level versus top level design specific and/or (vi) ensure that the top-level design errors are fixed via automated and/or manual means.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
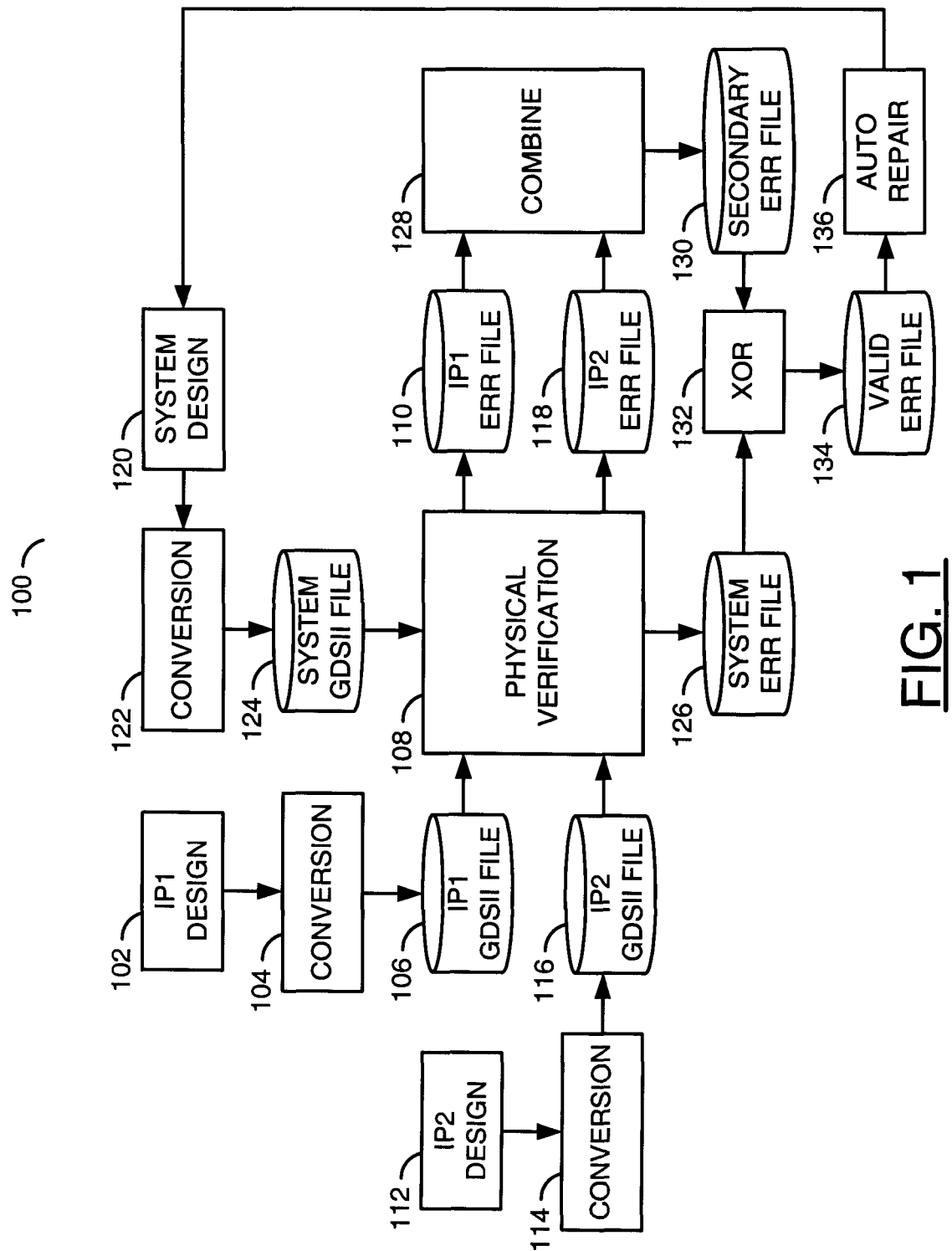
FIG. 1 is a flow diagram of an example method to waive physical verification failures in a system design is shown in accordance with a preferred embodiment of the present invention.

Referring to FIG. 1, a flow diagram of an example method 100 to waive physical verification failures in a system design is shown in accordance with a preferred embodiment of the present invention. The method (or process) 100 may be implemented as a software tool executable on a computer. The method 100 generally comprises a step (or block) 102, a step (or block) 104, a step (or block) 106, a step (or block) 108, a step (or block) 110, a step (or block) 112, a step (or block) 114, a step (or block) 116, a step (or block) 118, a step (or block) 120, a step (or block) 122, a step (or block) 124, a step (or block) 126, a step (or block) 128, a step (or block) 130, a step (or block) 132, a step (or block) 134 and a step (or block) 136.

The method 100 is generally operational to "mask" and/or "waive" specific errors in Intellectual Property (IP)/blocks/macros and/or any sub-blocks/building blocks used for developing and/or implementing a System-On-a-Chip (SoC). The method may permits an SoC owner to identify and focus on fixing only the top design level errors. Focusing on the top level errors generally provides an efficient and optimal design implementation and verification flow. The IP may refer to electronics circuits, blocks, modules, sub-circuits, hardware, firmware and the like. The IP may be created in-house and/or by outside vendors.

In the step 102, a first IP design (e.g., IP1 design) may be received from a circuit designer. The first IP design may exist in any of a variety of formats when received. In some cases, the first IP design may exist at a high abstract level, such as a Register Transfer Language level. In other cases, the first IP design may have already undergone a preliminary place and route before being received in the step 102. Other design formats may be implemented to meet the criteria of a particular application. The first IP design may be converted into a layout format in the step 104. The layout format may include, but is not limited to the standard Graphic Data System II (GDSII) layout format. The first IP layout data may be stored in a file in the step 106.

A physical verification of the first IP design layout may be performed in the step 108. The physical verification may include, but is not limited to, a Design Rule Check (DRC), a Layout Versus Schematic (LVS) check, an Electronic Rule Check (ERC) and/or an Antenna Rule Check (ARC). The physical verification generally identifies one or more circuit design errors based on the particular rules being referenced. The circuit design errors may be stored in a first circuit error file in the step 110. The first circuit error file may be stored in a recording medium. Where the first IP design is considered available for integration into larger designs, the circuit design errors in the first circuit error file are generally considered acceptable errors that will either not be fixed or may be fixed later.

In the step 112, a second IP design may be received from the same circuit designer or a different circuit designer. As with the first IP design, the second ID design may exist in any of a variety of formats when received. The second IP design may be converted into the layout format in the step 114. The second IP layout may be stored in a file in the step 116. A physical verification may be performed on the second IP design layout in the step 108. One or more errors detected during the second physical verification may be stored in a second circuit error file in the step 118. The second circuit error file may be stored either in the same recording medium or a different recording medium as the first circuit error file. Where the second IP design is considered available for integration into larger designs, the circuit design errors in the second circuit error file are generally considered acceptable errors that will either not be fixed or may be fixed later. The process of receiving and verifying additional IP designs may be continued as appropriate, based on the number of IP designs that are to be incorporated into a larger system design, such as a SoC design.

In the step 120, the various IP designs that have been received and physically verified may be incorporated into the system design. The system design may include, but is not limited to a chip (or die) level design, a SoC level design and a board level design. The system design generally comprises one or more instantiations of the smaller IP designs received in the steps 102, 112 and the like. Other system design types may be implemented to meet the criteria of a particular application.

The system design may be converted in the step 122 into the layout format. The resulting system layout may be stored in a file in the step 124. A physical verification of the system layout may be performed by the computer in the step 108. The physical verification of the system layout may include, but is not limited to, the DRC, the LVS check, the ERC and/or the ARC. All errors identified during the physical verification may be stored in a system error file in the step 126.

In the step 128, all of the circuit error files (e.g., created in the steps 110 and 118) may be combined into a secondary error file. The secondary error file may account for the errors associated with each instance of each IP design incorporated into the system design. The secondary error file may include data that accounts for the physical translations (locations) of the IP design instances, any rotations of the IP design instances and any possible mirroring of the IP design instances. The secondary error file generally matches the system error file in terms of the physical extent of the system design, but may be limited to instantiations of the circuit errors at coordinates, rotations and mirroring that matches the physical representation of the system design.

The error files may be combined using a Graphic System Design (GDS) editor through manual or programmatic techniques wherein a physical extent of the system layout may be initially created, followed by the individual instantiations of the various IP design error files at the appropriate coordinates (e.g., coordinates, rotations and mirroring as used in the system level design). GDS editors may be commercially available from third-party tool vendors, such as Synopsys and Mentor Graphics. The secondary error file may be stored in the step 130.

The circuit errors contained in the secondary error file may be waived from the system error file in the step 132 to create a valid error file. Waiving may be accomplished by comparing the two files using an exclusive-OR (XOR) function operating on the respective sets of errors. Where the system error file contains design errors matching circuit errors caused by a particular IP design, such circuit errors may be removed by the XOR operation leaving only new system-level errors in the valid error file. Where the system error file contains circuit errors induced by the top-level system design, the XOR operation will pass such errors through to the valid error file.

The valid error file may be stored in a recording medium in the step 134. In some embodiments, the valid error file may replace the system error file. In other embodiments, both error files may co-exist.

In general, the XOR operation is essentially a Boolean operation performed on all data objects that comprise the design database being XORed. The data objects may include, but are not limited to, all layers of routing, vias, dummy metal and logic building blocks that may be encompassed, such as gates, memories and other embedded sub-blocks. The XOR operation between two different sets of databases generally helps create a "results" database, wherein the results database contains data (comprised of the design objects described above) wherein no "exact" overlaps occur. If two similar objects in the two different databases are at the exact same coordinate locations, the two similar objects will not show up in the "results" database.

An optional design repair tool may use the valid error file to automatically repair one or more flaws in the system design in the step 136. The method 100 may be repeated once the system design has been repaired and/or updated. The method 100 may also be repeated after repaired and/or updated IP circuits have been received from the respective circuit designers. Iterations on the system design verification may be continue until either all of the system-level errors have been corrected, a number of remaining system-level errors falls below an acceptable threshold and/or the remaining system-level errors are waived by the system designers.

Figure 2:
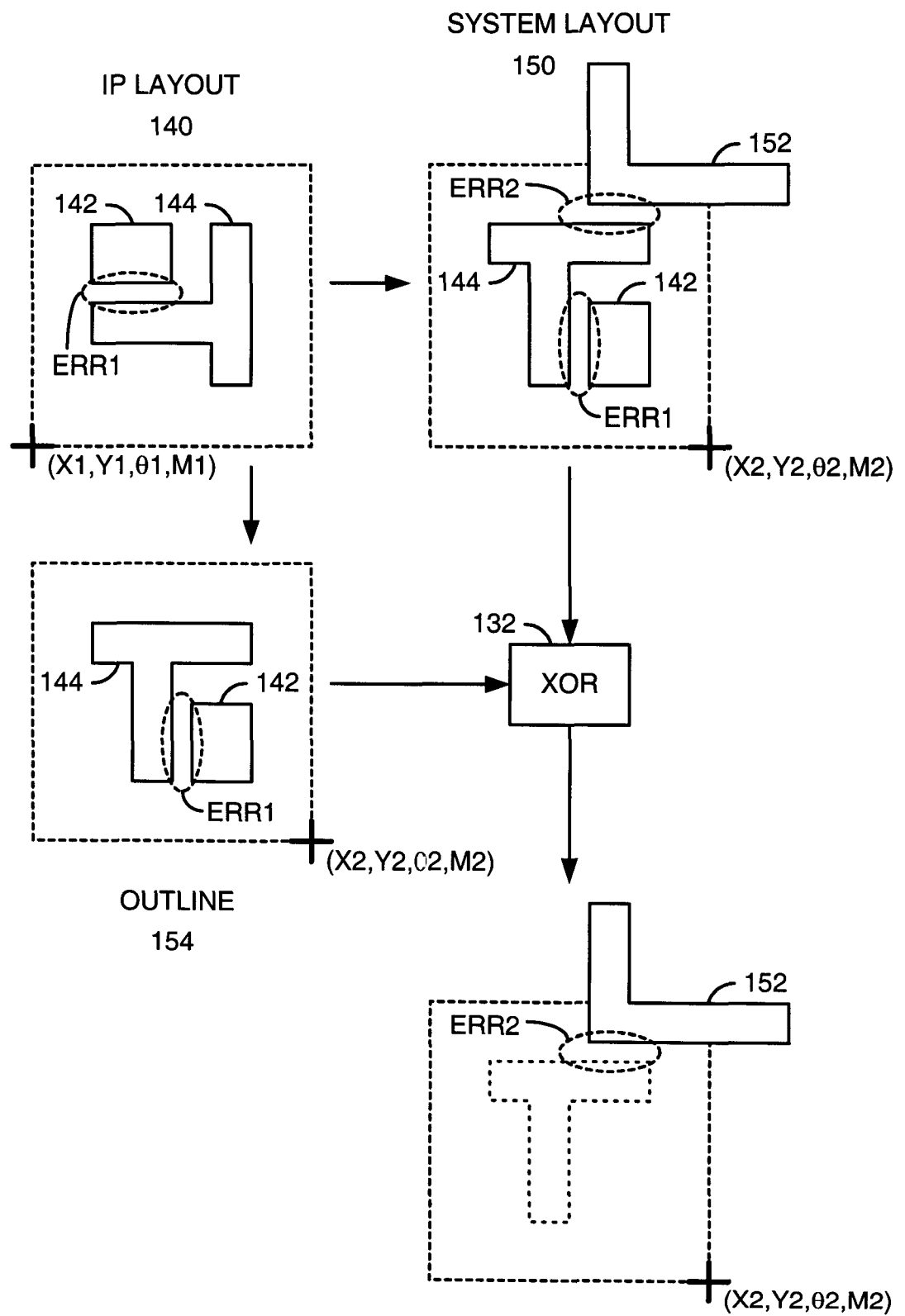
FIG. 2 is a diagram of example faults detected by physical verification.

Referring to FIG. 2, a diagram of example faults detected by physical verification is shown. An example circuit layout 140 of a portion of a given IP circuit design may include two objects 142 and 144 (e.g., metal patterns). The IP circuit design (cell) 140 may have an origin defining the location, rotation and mirroring aspect (e.g., (X1, Y1, θ1, M1) of the design. A separation between the object 142 and the object 144 may be too close per a design rule and thus fail the physical verification in the step 108. The resulting circuit fault (e.g., ERR1) may be recorded in a circuit error file. However, since the object 142 and the object 144 both are always near or at ground potential, the fault ERR1 may remain unfixed in the first IP layout.

An example system layout 150 of a portion of a system design may (i) incorporate the object 142 and the object 144 and (ii) add an additional object 152. The objects 142 and 144 may be moved, rotated and mirrored (e.g., (X2, Y2, θ2, M2) in the system layout 150 compared with the circuit layout 140. Despite the movement, rotation and mirroring, the fault ERR1 may remain detectable by the physical verification step 108 operating on the system layout. Furthermore, another fault (e.g., ERR2) may be detected during the physical verification of the system layout due to the positioning of the object 152 relative to the object 144. The resulting system error file may include both the faults ERR1 and ERR2.

A top level outline 154 of the system database may be created in the step 128 with instantiations of the IP layouts. The top level outline 154 may include the correct translations, rotations and mirroring of the IP layouts as used in the system layout 150 (e.g., the circuit layout 140 placed at (X2, Y2, θ2, M2)). As such, the resulting secondary error file 130 may include only the fault ERR1.

Upon performing the XOR step 132, the fault ERR1 in the system error file 126 may be canceled by the fault ERR1 in the secondary error file 130 (e.g., the "new" IP-system error file that contains the instantiations of all of the IP error files with the correct rotations, mirroring and translations). However, the fault ERR2 in the system error file 126 has no corresponding error in the secondary error file 130 and thus may be passed by the XOR step 132 into the valid error file 134.

Figure 3:
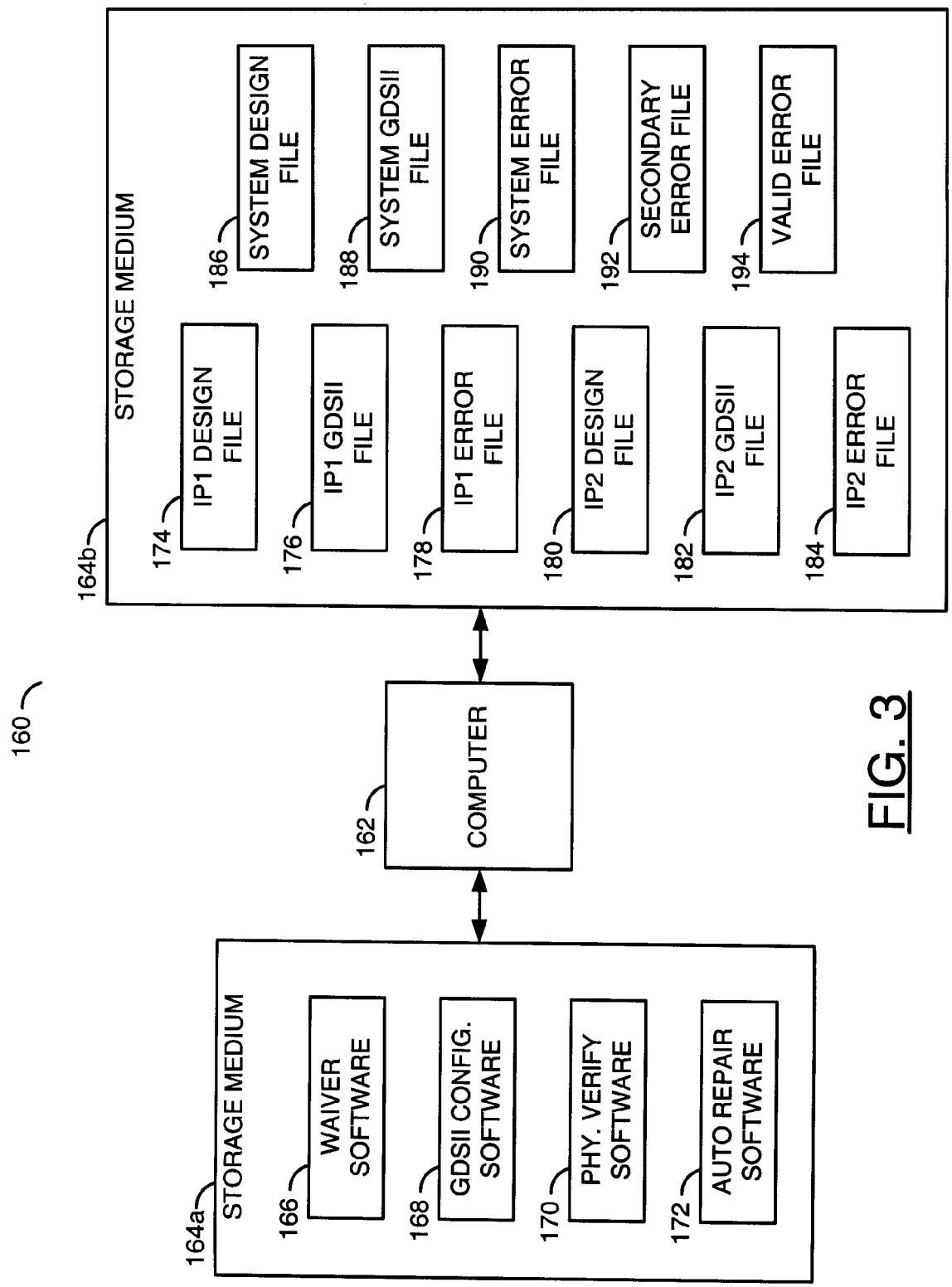
FIG. 3 is a block diagram of an example apparatus implementing the method.

Referring to FIG. 3, a block diagram of an example apparatus 160 implementing the method 100 is shown. The apparatus 160 may be implemented as a computer 162 and one or more storage media 164a-164b. A storage medium 164a may store a software program 166, a software program 168, a software program 170 and an optional software program 172. The software program 166 may implement the combination step 128 and the XOR step 132 of the waiver method 100. The software program 168 may perform the design-to-layout conversions 104, 114 and 122 to create the GDSII layout files. The software program 170 generally implements the physical verification step 108. The automatic repair step 136 may be implemented by the software program 172.

The storage (or recording) medium 164b may hold multiple files containing the designs, layouts and errors of the various IP designs and the system design. The files generally include, but are not limited to, a first IP design file 172, a first IP layout file 174 and a first IP error file 176. Furthermore, the files may include a second IP design file 180, a second IP layout file 182 and a second IP error file 184. A file 186 may store the system design, a file 188 may store the system layout and a file 190 may store the system errors. The secondary errors may be held in a file 192. The valid errors are generally stored in a file 194.

The software programs 166-172 may be read and executed by the computer 162 to implement the process of masking existing problems within the IP designs from the overall system design (e.g., method 100). The files 174-194 may be created and accessed as appropriate during execution. In some embodiments, the software programs 166-172, and the files 174-194 may be stored in the same storage medium.

The functions performed by the diagrams of FIGS. 1 and 2, may be implemented using a conventional general purpose digital computer programmed according to the teachings of the present specification, as will be apparent to those skilled in the relevant art(s). Appropriate software coding can readily be prepared by skilled programmers based on the teachings of the present disclosure, as will also be apparent to those skilled in the relevant art(s).

The present invention may also be implemented by the preparation of ASICs, FPGAs, or by interconnecting an appropriate network of conventional component circuits, as is described herein, modifications of which will be readily apparent to those skilled in the art(s).

The present invention thus may also include a computer product which may be a storage medium including instructions which can be used to program a computer to perform a process in accordance with the present invention. The storage medium can include, but is not limited to, any type of disk including floppy disk, optical disk, CD-ROM, magneto-optical disks, ROMs, RAMs, EPROMs, EEPROMs, Flash memory, magnetic or optical cards, or any type of media suitable for storing electronic instructions.

While the invention has been particularly shown and described with reference to the preferred embodiments thereof, it will be understood by those skilled in the art that various changes in form and details may be made without departing from the scope of the invention.

The invention claimed is:

1. A method of waiving verification failures, comprising the steps of:
    (A) generating a plurality of circuit error files by performing a plurality of physical verifications on a plurality of circuit designs, each of said circuit error files containing a plurality of circuit errors of a respective one of said circuit designs;
    (B) generating a system error file by performing an additional physical verification on a system design separate from said physical verifications of said circuit designs, said system error file containing a plurality of system errors of said system design, said system design incorporating said circuit designs; and
    (C) generating a valid error file in a non-transitory storage medium by removing said circuit errors from said system error file, said valid error file containing a plurality of valid errors comprising a subset of said system errors.

2. The method according to claim 1, wherein each of said physical verifications comprises a design rule check.

3. The method according to claim 1, further comprising the step of:
    generating a secondary error file by combining said circuit error files, said secondary error file containing at least one instantiation of said circuit errors corresponding to each respective instantiation of said circuit designs in said system design.

4. The method according to claim 3, wherein generating said valid error file comprises the sub-step of:
    performing an exclusive-OR between said secondary error file and said system error file such that said circuit errors are excluded from said valid errors.

5. The method according to claim 3, wherein said secondary error file comprises a plurality of locations, a plurality of rotations and a plurality of mirroring aspects of said circuit designs within said system design.

6. The method according to claim 1, further comprising the step of:
    generating a plurality of circuit layout files of said circuit designs, wherein said physical verifications are performed on said circuit layout files.

7. The method according to claim 6, further comprising the step of:
    generating a system layout file of said system design, wherein said additional physical verification is performed on said system layout file.

8. The method according to claim 7, wherein said circuit layout files and said system layout file comprise a plurality of Graphic Data System II format files.

9. The method according to claim 1, further comprising the step of:
    automatically repairing said system design based on said valid errors and ignoring said circuit errors.

10. The method according to claim 1, wherein each of said physical verifications comprises at least one of (i) a layout versus schematic check, (ii) an electronic rule check and (iii) an antenna rule check.

11. A non-transitory storage medium for use in a computer to waive verification failures, the non-transitory storage medium recording a computer program that is readable and executable by the computer, the computer program comprising the steps of:
    (A) generating a plurality of circuit error files by performing a plurality of physical verifications on a plurality of circuit designs, each of said circuit error files containing a plurality of circuit errors of a respective one of said circuit designs;
    (B) generating a system error file by performing an additional physical verification on a system design separate from said physical verifications of said circuit designs, said system error file containing a plurality of system errors of said system design, said system design incorporating said circuit designs; and (C) generating a valid error file by removing said circuit errors from said system error file, said valid error file containing a plurality of valid errors comprising a subset of said system errors.

12. The storage medium according to claim 11, wherein each of said physical verifications comprises a design rule check.

13. The storage medium according to claim 11, further comprising the step of:
generating a secondary error file by combining said circuit error files, said secondary error file containing at least one instantiation of said circuit errors corresponding to each respective instantiation of said circuit designs in said system design.

14. The storage medium according to claim 13, wherein generating said valid error file comprises the sub-step of:
performing an exclusive-OR between said secondary error file and said system error file such that said circuit errors are excluded from said valid errors.

15. The storage medium according to claim 13, wherein said secondary error file comprises a plurality of locations, a plurality of rotations and a plurality of mirroring aspects of said circuit designs within said system design.

16. The storage medium according to claim 11, further comprising the step of:
generating a plurality of circuit layout files of said circuit designs, wherein said physical verifications are performed on said circuit layout files.

17. The storage medium according to claim 16, further comprising the step of:
generating a system layout file of said system design, wherein said additional physical verification is performed on said system layout file.

18. The storage medium according to claim 17, wherein said circuit layout files and said system layout file comprise a plurality of Graphic Data System II format files.

19. The storage medium according to claim 11, further comprising the step of:
automatically repairing said system design based on said valid errors and ignoring said circuit errors.

20. An apparatus comprising:
means for storing; and
means for programming a computer to waive verification failures disposed in said means for storing, said means for programming comprising the steps of:

(A) generating a plurality of circuit error files by performing a plurality of physical verifications on a plurality of circuit designs, each of said circuit error files containing a plurality of circuit errors of a respective one of said circuit designs;

(B) generating a system error file by performing an additional physical verification on a system design separate from said physical verifications of said circuit designs, said system error file containing a plurality of system errors of said system design, said system design incorporating said circuit designs; and (C) generating a valid error file by removing said circuit errors from said system error file, said valid error file containing a plurality of valid errors comprising a subset of said system errors.

* * * * *